United States Patent [19]

Keusseyan et al.

[11] Patent Number: 5,033,666

[45] Date of Patent: Jul. 23, 1991

[54] PROCESS FOR BRAZING METALLIZED COMPONENTS TO CERAMIC SUBSTRATES

[75] Inventors: Roupen L. Keusseyan, Raleigh, N.C.; William J. Nebe, Wilmington, Del.; James J. Osborne, Kennet Square, Pa.

[73] Assignee: E. I. Du Pont de Nemours and Company, Wilmington, Del.

[21] Appl. No.: 508,871

[22] Filed: Apr. 12, 1990

[51] Int. Cl.$^5$ ................................................. B23K 1/19
[52] U.S. Cl. ................................. 228/122; 228/124; 228/248; 228/254
[58] Field of Search .......................... 228/120–124, 228/208, 248, 254, 263.12

[56] References Cited

U.S. PATENT DOCUMENTS

| 2,857,664 | 10/1958 | Luks et al. | 228/124 |
| 3,006,069 | 10/1961 | Rhoads et al. | 228/124 |
| 3,281,931 | 11/1966 | Ritz | 228/124 |
| 3,590,468 | 7/1971 | Buck | 228/124 |

FOREIGN PATENT DOCUMENTS 1009954  11/1965  United Kingdom ................ 228/124

*Primary Examiner*—Samuel M. Heinrich

[57] ABSTRACT

A process for brazing a metallized component to a metallized ceramic-based substrate comprising the steps of:

(a) applying a second conductor composition over the metallizations on the substrate such that the metallizations are covered by said second conductor composition which consists essentially of a metal powder and an organic medium;

(b) drying said second conductor composition;

(c) firing said second conductor composition at a temperature sufficient to sinter the metal powder of the second conductor composition and drive off said organic medium thereby forming a second metallization layer;

(d) forming an assembly by positioning at least one metallized component on said second metallization layer and a brazing composition at the component-second metallization layer interface; and (e) heating said assembly at a temperature sufficient for said brazing composition to form a joint between said component and said second metallization layer.

12 Claims, No Drawings

PROCESS FOR BRAZING METALLIZED COMPONENTS TO CERAMIC SUBSTRATES

FIELD OF THE INVENTION

This invention relates to a brazing process. More particularly, this invention relates to a process of brazing metallized components to ceramic substrates.

BACKGROUND

The current trend in microelectronic packaging is toward high performance applications which demand both a higher density of electronic functionality and functionalities which operate at higher speeds. Producing electronic packages which operate reliably and meet these demands of high performance applications is a challenge facing the microelectronic industry. One particularly difficult aspect of producing such packages is producing joints or bonds in multilayer packages between metallized components such as pins, leads, window frames or heat sinks and ceramic substrates. These joints or bonds must have the mechanical durability, electrical conductivity and heat dissipation necessary to ensure reliable performance under the varying and extreme conditions encountered in high performance applications. Further, the process or method of joining the metallized components to the ceramic substrate must be as cost effective and simple as possible.

Currently in multilayer electronic packaging, there are several methods for attaching metallized components to ceramic substrates. The attachment method used is dependent upon the type of multilayer package being fabricated. For high temperature cofired systems which use alumina-based dielectric layers and tungsten or molybdenum metallizations, a brazing method is used for attachment. The brazing is carried out at a temperature of about 840° C. in a hydrogen-nitrogen atmosphere. This method results in good bond strengths and allows for temperature latitude in subsequent processing.

Low temperature thick film or cofired dielectric sheet systems use glass and alumina-based dictrics and gold, silver or copper based metallization. Brazing has not been successful with low-temperature systems because the temperatures of firing and brazing are essentially the same. This creates a condition where, during the brazing operation, the braze attacks the previously formed bond between the metallization and the ceramic, causing the metallization to separate from the substrate. A disruption of the electrical conductivity results rendering the package useless. Common methods of attachment which are used in lieu of brazing for these low temperature systems include soldering, wire-bonding and welding, such as thermal compression and parallel gap welding.

Both of the foregoing systems including the respective methods of attachment are currently in use. However, these systems suffer from some disadvantages in high performance applications. In the high-temperature cofired packages, the electrical conductivity of the metallizations formed with tungsten and molybdenum is not as high as desired for high performance applications. In the low-temperature packages, the conductivity of the gold, silver or copper metallization is good, but the bond strengths are typically lower than those obtained by brazing and are not as high as desired for high performance applications. In addition, solder joint integrity can be lost during some subsequent processing operations.

The effect of subsequent operations on prior process steps is an important consideration in electronic package manufacture. For example, the process of attaching pins using brazing methods should not affect the integrity of the sintered circuitry in the package. Similarly, the subsequent process of attaching a semiconductor chip should not affect the integrity of the brazed pins or sintered circuit lines. If the temperature of a subsequent step is as high or higher than the temperature of a previous step, the integrity of the product from the previous step will very likely be affected by the subsequent step. To avoid such complications, electronic package manufacturers strive to design processes with a temperature hierarchy. Then, the integrity of each process step is preserved throughout the entire manufacturing process. In fact, the higher the temperature at which the last process step occurs in the formation of a complete package, the greater the temperature interval between subsequent processing and the more likely the package will be unaffected by thermal influences. Another advantage of a process having a temperature hierarchy is that the process can become modular. Thus, one can test subunits before final assembly, thereby easing diagnostic work and assuring high final quality levels in the system product.

Therefore, it is an object of this invention to provide a process of brazing metallized components to ceramic substrates in such a way as to form a strong joint and not cause a loss of adhesion at the interface of the metallization and the ceramic substrate. It is also an object of this invention to provide a process of brazing metallized components to ceramic, glassceramic and metal substrates using metal paste that has high electrical conductivity. And, it is a further object of this invention to provide a reliable method for high temperature attachment of metallized components to a ceramic based substrate while preserving the temperature hierarchy of the low temperature fired or cofired systems and allowing the same subsequent processing methods commonly used in high temperature cofired systems.

SUMMARY

The process of this invention provides high temperature attachment in the range of 500° to 840° C. of metallized components to metallizations on a ceramic substrate or dielectric layer with the aid of a brazing compound. Basically, the process comprises the successive application and firing of at least two metallization layers, each with different compositions, to the surface of a ceramic based substrate and then heating the metallized substrate with metal components and a brazing compound, in positions where the component or components are to attach to the surface, to a temperature sufficient to form a joint.

In particular, this invention relates to a process for brazing a metallized component to a ceramic-based substrate comprising the steps of:

(a) applying a first conductor composition to a ceramic-based substrate, the first conductor composition comprising a metal powder, an inorganic binder, and an organic medium;

(b) drying said first conductor composition;

(c) firing said first conductor composition at a temperature sufficient to cause said inorganic binder to wet the ceramic, to sinter said metal powder and to drive off the organic medium thereby forming a first metallization layer;

(d) applying a second conductor composition to said first metallization layer such that said first metallization layer is covered by the second metallization layer, the second conductor composition comprising a metal powder and an organic medium;

(e) drying said second conductor composition;

(f) firing said second conductor composition at a temperature sufficient to sinter the metal powder of the second conductor composition and drive off the organic medium thereby forming said second metallization layer;

(g) forming an assembly by positioning at least one metallized component on the second metallization layer and a brazing composition at the component-second metallization layer interface; and (h) heating said assembly at a temperature sufficient for said brazing composition to form a joint between said component and said second metallization layer.

DETAILED DESCRIPTION

It is understood by one skilled in the art that attachment of components to a ceramic based electronic structure typically occurs after a series of steps which formed the internal circuitry in a body of the package. These steps prior to component attachment, e.g., via formation, internal metallization formation, etc. would still be the same according to the type of ceramic technology being used to fabricate the package. Thus, the metal components are attached to a substrate which is usually the exterior surface layer of the structure.

Substrates for use in this invention can be any of the well-known ceramic-based substrates conventional in the art. Examples of ceramic-based substrates include the ceramic substrates such as the aluminas, the beryllias, the hafnias, nitrides, carbides, etc. Also suitable for use as ceramic-bases substrates in this invention are glass-ceramics and advanced ceramics such as aluminum nitride, silicon carbide, silicon nitride and boron nitride. A preferred substrate for use in this invention is an alumina substrate comprised of 96% $Al_2O_3$, most preferred is a glass-ceramic product, such as Green-Tape(TM) sold by E. I. du Pont de Nemours & Co., Wilmington, DE ("Du Pont").

A first thick film conductor composition is then applied to a ceramic substrate by conventional technique. A preferred process is screen printing to a wet thickness of about 20–80 microns, preferably 25–70 microns, and most preferably 30–40 microns. The printed patterns are then dried at about 50°–200° C. for about 5 to 15 minutes. Firing to form a first metallization layer is preferably done in a belt conveyor furnace with a temperature profile that will allow burnout of the organic matter at about 300°–660° C., a period of maximum temperature of about 600°–1050° C. lasting about 5 to 25 minutes, followed by a controlled cool-down. A preferred fired thickness of the first metallization layer is about 5–20 microns. The overall firing procedure will preferably extend over a period of about 1 hour, with 20 to 25 minutes to reach firing temperature, about 10 minutes at the firing temperature, and about 20–25 minutes in cooldown.

Conductor compositions are well-known in the art. Conductor compositions which are applied to and fired on ceramic dielectric substrates to form a first metallization pattern usually comprise finely divided metal particles and inorganic binder particles. The metallic component of the composition provides the functional (conductive) utility, while the inorganic binder bonds the metal particles to one another and to the substrate. Most often, the inorganic powders are dispersed in an inert liquid medium, or vehicle, so that this dispersion can be readily applied to the substrate. Metal particles useful in the conductor composition include gold, silver, copper, platinum, palladium or mixtures thereof. Inorganic binders include glass binders (frits) and metal oxides. Glass binders useful in the conductor composition are conventional in the art and can be, but are not limited to, $B_2O_3$, $SiO_2$, $Al_2O_3$, CdO, CaO, BaO, ZnO, $SiO_2$, $Na_2O$, PbO, and ZrO, etc. Similarly, metal oxides useful in the conductor composition are conventional in the art and can be, but are not limited to ZnO, MgO, CoO, NiO, FeO, MnO and mixtures thereof.

The inorganic powders are mixed typically with an organic liquid medium (vehicle) by mechanical mixing to form a pastelike composition having suitable consistency and rheology for screen printing. A wide variety of inert liquids can be used as organic medium. The organic medium is conventional in the art and is typically a solution of resin(s) in solvent(s) and, frequently a solvent solution containing both resin and thixotropic agent. The most frequently used resin for this purpose is ethyl cellulose. However, resins such as ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents for thick film applications are terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. Various combinations of these and other solvents are formulated to obtain the viscosity and volatility requirements desired. In addition, the conductor composition can also include other metal particles and inorganic binder particles to enhance various properties of the composition, such as adhesion, sintering, processing, brazeability, solderability, reliability, etc.

Conventional silver, copper and gold conductor compositions for external circuitry are suitable for use in this invention. A preferred gold conductor composition comprises by weight basis total inorganic solids, finely divided particles of:

(a) 75-95% metallic gold particles at least 90% by weight of which particles have an aspect ratio no greater than 2;

(b) 0.5-10% cadmium borosilicate glass;

(c) 0.1-5% spinel-forming divalent metal oxide selected from the group consisting of CuO, ZnO, MgO, CoO, NiO, FeO, MnO and mixtures thereof;

(d) 0.1-1.0% metal selected from the group consisting of palladium, platinum and rhodium, all of (a) through (d) being dispersed in (e) an organic medium.

The invention encompasses the discovery that the application of a second metallization layer to the first metallization layer provides a strong joint between the substrate and the attached component. The second metallization layer acts as an electrically conductive barrier layer between the brazed metallized component and the ceramic-metallization interface.

The second metallization layer is formed from a second conductor composition that is applied to the first metallization layer using conventional thick-film techniques, preferably screen printing. It is important in this step to apply the second conductor composition in such a manner so as to completely coat or cover the exposed portions of the first metallization layer where the metal components are to be attached. This is performed by exact screen registration of the second conductor composition on the first metallization layer or by using a second screen for the second conductor composition with a slightly larger pattern (e.g. pad size) of about 5% compared to the pad size used for the first conductor composition. This may mean that several series of print, dry, fire steps would be required to cover the first metallization layer and to protect the ceramic-first metallization interface. Drying of the second conductor composition is the same as described above for the drying of the first conductor composition. The procedure for firing the second conductor composition is similar to that described for the first conductor composition except that conditions may be modified to accommodate the desired fired thickness of the second metallization layer. Fired thickness of the second metallization layer should be about 5–100 microns. The thickness depends on the type and the melting temperature of the brazing alloy to be used, as well as the brazing peak temperature and dwell time at the peak temperature. Typically, for a given dwell time, the higher the brazing peak temperature, the greater the thickness of the second layer. For example, at a one minute dwell time, the thickness of the second metallization layer generally should be about 10–30 microns for brazing peak temperatures of less than about 600° C., 30–50 microns for brazing peak temperatures of about 600°–700° C., and 40–70 microns for brazing peak temperatures of about 700°–810° C.

The second conductor composition which forms the second metallization layer comprises a finely divided metal powder dispersed in an organic medium. The metal particles in the second conductor composition sinter during the firing step to themselves and to the metal particles of the first metallization layer located at the interface between the first and second metallization layers. Metals suitable for use in the second conductor composition include gold, silver, copper, platinum, palladium, or mixtures thereof. Other metals may be used, but should be compatible with the metallurgical, thermal and electrical properties of the package. The function of the organic medium of the second conductor composition is the same as for the organic medium in the first conductor composition. Here too, the organic medium is conventional in the art and can have the same or different composition as the organic medium described for the first conductor composition. It is preferred that inorganic binders are not used in the second metallization layer. However, small amounts of inorganic binders up to 10 percent by weight of the solids can be used successfully.

In another embodiment of this invention, the separate firing of the first and second metallization layers can be combined as a single step. Prior to the combined firing step, the first conductor composition is applied and dried, then the second conductor composition is applied in registration and dried. Firing of both layers is similar to that described above for separate layer firing.

Metal components useful for attachment to ceramic substrates are for example pins, leads, window frames and heat sinks. These components are metallized since they function as an interconnect between other electronic packages or as in the case of heat sinks, for the absorption or dissipation of unwanted heat. Metallized components suitable for use in this invention can be formed from copper, nickel, molybdenum, tungsten, silver, gold, iron, carbon graphite or alloys or clads or mixtures thereof. Preferred for used with glass-ceramic substrates are alloys of iron and nickel such as Kovar, Alloy 42, Alloy 46 for pin and lead materials while copper/tungsten, copper/molybdenum, copper/molybdenum/copper, and copper/Invar/copper are used as heat sinks and spreaders. These materials are used because their Thermal Coefficients of Expansion (TCE's) are compatible with that of the metallizations and ceramic substrate that these materials contact. The compatible TCE helps to minimize the residual thermal stresses produced during the brazing process. Also, the metal components are able to retain their mechanical integrity (no appreciable annealing) after furnace brazing. The metal components can be plated with nickel alone or followed by gold, copper or silver if desired.

Conventional brazing filler metal compositions which are compatible with the second metallization layer and the metallized component, are suitable for use in this invention. Brazing compositions which contain silver, copper, gold, indium, zinc, tin, nickel, phosphorus, and germanium or mixtures thereof are suitable. Examples of brazing compositions are (1) 61.5Ag/24Cu/14.5In, (2) 56Ag/22Cu/17Zn/5Sn, (3) 78Cu/6Ni/9Sn/7P, and (4) 82Au/18In, wherein the numbers indicate weight percent. The type of brazing filler metal used is dependent upon the metal or metals in both the metallization barrier layer and the metallized component. Braze alloys (1) and (2) are most suitable for silver metallizations. Braze alloys (1), (2), (3) are most suitable for copper based metallizations and braze alloy (4) is most suitable for gold based metallizations. The braze compound can be in paste or preform state. The braze paste is applied using screen printing, stencil printing or other dispensing techniques. The braze can also be applied on the pad or the component and preflowed prior to the braze joining process.

Components to be joined by brazing are usually assembled in a fixed position which is maintained throughout the brazing cycle, typically through the use of auxiliary fixturing. Materials such as mild steels, Kovar, machinable ceramics, lava, and graphite are often used for auxiliary fixturing. A particularly preferred fixturing material is graphite. The selection of a fixturing material is determined by the material's properties, e.g., heat resistance, in conjunction with the brazing method employed, the brazing temperature and atmosphere used, the materials in the assembly, and the dimensional requirements for the finished package. Surfaces to be joined are spaced properly by the fixture to preserve joint clearance at room and brazing temperatures in order that the brazing filler metal may fill the joint and achieve maximum properties. The braze compound, in either paste or preform state, is located between the metallized component and the second metallization layer or can be on the metallized component in a manner such that the braze compound will fill the joint. For example, braze preform compound can be secured in place for brazing by the shaft of a pin component.

Brazing of the metallized components to the metallization layers of the ceramic substrate occurs in a brazing furnace where the fixtured assembly is placed. The assembly is gradually heated in the brazing furnace for a period of time and at a temperature sufficient to cause the braze filler metal compound to wet and form a joint.

The peak temperature is normally 20° to 80° C. higher than the melting point of the braze filler metal. The fixtured assembly is heated at the peak temperature for a very short period of time, usually on the order of 1 minute, followed by a gradual cool-down. Suitable furnaces for brazing are batch, and belt conveyor (infrared or muffle). Preferred is to use a belt conveyor furnace.

It is well within the purview of one skilled in the art to select metallized components, metallization layers, brazing compound, and ceramic-based substrate for the electronic package which are compatible. Incompatibility of the materials would result in, at best, a weak joint at the interface between the incompatible materials, and the package would fail at this location when in use. Compatibility of the materials to attach a metallized component to the substrate (and in reality for the entire package) includes concerns to complement metallurgical, thermal, and electrical properties.

EXAMPLES

Example 1

This example illustrates the process of this invention for brazing metallized pins to a glass ceramic substrate using gold based first and second metallization compositions and an 82 Au/18 In brazing compound.

(a) The thick film paste was a gold conductor composition, type 5062, sold by Du Pont.

(b) The substrate used in this example is a glass ceramic tape sold Du Pont as GreenTape(TM) (type 851AT). The tape substrate was cut to 1.760×1.760 in. after cofiring. A body of a multilayer electronic package was fabricated with 10 layers of the 851AT GreenTape(TM) using methods known in the art.

(c) The paste of step (a) was printed on the external surface layer of the fired package body formed in (b) in one stroke with an 885 AMI printer, (manufactured by AMI Inc., North Branch, N.J.) to a wet thickness of 45 microns in order to achieve a fired thickness of 10 to 15 microns. The printed paste was located where the metallized components were to be attached. The paste on the green tape was dried in a Blue M oven, manufactured by Blue M Co. (Malvern, Pa.) in a nitrogen atmosphere at a temperature of 150° C. for 15-30 minutes. The paste was fired in a Lindberg furnace, (Lindberg, Chicago, Ill.) with an approximate cycle time of 1 hour, in which about 20 to 25 minutes was heating to firing temperature, firing occurred for 10 minutes at 850° C. and a controlled cooldown was for the remainder of the cycle time.

(d) The second conductor composition comprised 88% gold flake powder and 12% an organic medium.

(e) The second conductor composition from step (d) was printed over the first conductor metallization layer to a wet thickness of 40-50 microns, with the 885AMI printer described in step (c) above. It is printed in such a manner as to completely cover the initial metallization layer including the sides of the bonding pads, by using a second screen for the second layer metallization with slightly larger pad size (about 5% larger) compared to the pad size of the first layer. The second conductor composition was printed in two print and dry steps in order to achieve the desired fired thickness of about 25 microns. Similar to step (c) above, the second conductor composition was dried in a Blue M oven.

(f) The paste was fired in a Lindberg furnace, with an approximate cycle time of 1 hour, in which about 20 to 25 minutes was heating to firing temperature, firing occurred for 10 minutes at 850° C. and a controlled cooldown was for the remainder of the cycle time.

(g) Kovar pins, sold by Astro Precision Inc., (Bayville, Conn.) were plated with 50 microinches of nickel and 50 microinches of gold by Surtronics Company, (Raleigh, N.C.).

(h) The package components were assembled in graphite fixture which held the ceramic substrate with the successive metallization layers, the brazing preform, and the plated pins in the proper positions on the metallization layer for firing. The brazing preforms were made of 82Au/18In and are sold by Advanced Material Technology Corp., (Oriskany, N.Y.). The brazing preform was washer shaped and was placed over the extending pin shaft resting upon the head of the pin. The head of the pin was placed on the second metallization layer and held in place by the graphite fixture.

(i) Brazing was performed in a Watkins-Johnson furnace (Watkins-Johnson Co., Scotts Valley, Calif.) at a one hour profile with a peak temperature of 580° C. for 2 minutes using a 3.7% hydrogen 96.3% nitrogen atmosphere. After the part had cooled sufficiently, the graphite fixture was disassembled and the assembled package removed.

The strength of the pin attachment or joint to the ceramic substrate was tested on an Instron machine, (Instron Corp., Canton, Mass.) with a crosshead speed 12 mm/min. The average strength to pull the pin from the substrate and/or the metallization layer was 18±3 pounds tested over 600 pins. This is very good strength of attachment performance of ceramic based systems.

Example 2

This example explains the process of this invention for brazing metallized components to a glass ceramic substrate using silver based first and second metallization compositions and a brazing compound, for use as a pin-grid array in microelectronic packages.

(a) The thick film paste was a silver conductor composition, type 5081, sold by Du Pont. The substrate was prepared as in Example 1 step (b). The silver conductor paste was printed on the external surface of the fired package body with an 885 AMI printer to a wet thickness of 45 microns in order to achieve a fired thickness of 10 to 15 microns. The printed paste was located where the metallized components were to be attached.

(b) The paste on the substrate was dried in Blue M oven, manufactured by Blue M Co. (Malvern, Pa.) in an air atmosphere at a temperature of 150° C. for 15-30 minutes.

(c) The paste was fired in a Lindberg furnace, (Lindberg, Chicago, Ill.) with an approximate cycle time of 1 hour, in which about 20 to 25 minutes was heating to firing temperature, firing occurred for 10 minutes at 850° and a controlled cooldown was for the remainder of the cycle time.

The second conductor composition comprised metallic silver powder and an organic medium (silver conductor, type 5082, sold by Du Pont).

(d) The second conductor composition was printed over the first conductor metallization layer as described in step (e) in Example 1 above, in several print and dry steps in order to achieve a fired thickness of 60 microns.

(e) Similar to step (b) above, the second conductor composition was dried in Blue M oven.

(f) The paste was fired in a Lindberg furnace, with an approximate cycle time of 1 hour, in which about 20 to 25 minutes was heating to firing temperature, firing occurred for 10 minutes at 850° C. and a controlled cooldown was for the remainder of the cycle time.

(g) Kovar pins, sold by Astro Precision Inc., (Bayville, CT) were plated with 50 microinches of nickel by Surtronics Company, (Raleigh, NC).

(h) The package components were assembled in a graphite fixture which held the ceramic substrate with the successive metallization layers, the brazing preform, and the plated pins in the proper positions on the metallization layer for firing. The brazing preforms were made of (61.5 Silver/24 Copper/14.5 Indium) and are sold by GTE Wesgo (Belmont, Calif.) The brazing preform was washer shaped and was placed over the extending pin shaft resting upont he head of the pin. The head of the pin was placed on the second metallization layer and held in place by the graphite fixture. (i) Brazing was performed in an RTC furnace (Radiant Technology Corporation, Cerritos, Calf.) at a one hour profile with a peak temperature of 780° C. for 1 minute using a nitrogen atmosphere. After the part had cooled sufficiently, the graphite fixture was disassembled and the assembled package removed.

The strength of the pin attachment or joint to the ceramic substrate was tested on an Instron machine, (Instron Corp., Canton, Mass.) with a crosshead speed of 12 mm/min. The average strenght to pull the pin from the substrate and/or the metallization layer was 22±2 pounds tested over 600 pins.

EXAMPLE 3

This example explains the process of this invention for brazing a metallized component to an alumina substrate using palladium/silver based first and second metallization compositions and a brazing compound, for use as a pin-grid array in microelectronic packages.

(a) The thick film paste was a palladium/silver conductor composition, type 5083, sold by Du Pont. The substrate was 96% alumina, sold by Coors Inc. (Colorado). The silver conductor paste was printed on the alumina substrate with an 885 AMI printer to a wet thickness of 45 microns in order to achieve a fired thickness of 10 to 15 microns. The printed paste was located where the metallized components were to be attached.

(b) The paste on the substrate was dried in Blue M oven, manufactured by Blue M Co. (Malvern, PA) in an air atmosphere at a temperature of 150° C. for 15-30 minutes.

(c) The paste was fired in a Lindberg furnace, (Lindberg, Chicago, IL) with an approximate cycle time of 1 hour, in which about 20 to 25 minutes was heating to firing temperature, firing occurred for 10 minutes at 850° C. and a controlled cooldown was for the remainder of the cycle time.

The second conductor composition comprised metallic palladium powder, metallic silver powder and an organic medium(palladium/silver based conductor, type 5084, sold by Du Pont).

(d) The second conductor composition was printed over the first conductor metallization layer as described in step (e) in Example 1 above, in several print and dry steps in order to achieve a fired thickness of 60 microns.

(e) Similar to step (b) above, the second condcutor composition was dried in a Blue M oven.

(f) The paste was fired in a Lindberg furnace, with an approximate cycle time of 1 hour, in which about 20 to 25 minutes was heating to firing temperature, firing occured for 10 minutes at 850° C. and a controlled cooldown was for the remainder of the cycle time.

(g) Kovar pins, sold by Astro Precision Inc., (Bayville, Conn.) were plated with 50 microinches of nickel by Surtronics Company (Raleigh, N.C.).

(h) The package components were assembled in a graphite fixture which held the ceramic substrate with the successive metallization layers, the brazing preform, and the plated pins in the proper positions on the metallization layer for firing. The brazing preforms were made of (61.5 Silver/24 Copper/14.5 Indium) and are sold by GTE Wesgo (Belmont, Calif.). The brazing preform was washer shaped and was placed over the extending pin shaft resting upon the head of the pin. The head of the pin was placed on the second metallization layer and held in place by the graphite fixture.

(i) Brazing was performed in an RTC furnace (Radiant Technology Corporation, Cerritos, Calif.) at a one hour profile with a peak temperature of 780° C. for 1 minute using a nitrogen atmosphere. After the part had cooled sufficiently, the graphite fixture was disassembled and the assembled package removed.

The strength of the pin attachment or joint to the ceramic substrate was tested on an Instron machine, (Instron Corp., Canton, Mass.) with a crosshead speed of 12 mm/min. The average strength to pull the pin from the substrate and/or the metallization layer was 20±2 pounds tested over 600 pins.

Example 4

This example explains the process of this invention for brazing metallized components to alumina substrate using copper based first and second metallization compositions and a brazing compound, for use as a pin-grid array in microelectronic packages.

(a) The thick film paste was a copper conductor composition, type 5085, sold by Du Pont. The substrate was 96% alumina, sold by Coors, Inc. (Colorado). The copper conductor paste was printed on the alumina substrate with an 885 AMI printed to a wet thickness of 45 microns in order to achieve a fired thickness of 10 to 15 microns. The printed paste was located where the metallized components were to be attached.

(b) The paste on the substrate was dried in Blue M oven, manufactured by Blue M Co. (Malvern, Penn.) in a nitrogen atmosphere at a temperature of 80° C. for 15-40 minutes.

(c) The paste was fired in an RTC furnace (Radiant Technology Corp., Cerritos, Calif.) with an approximate cycle time of 1 hour, in which about 20 to 25 minutes was heating to firing temperature, firing occurred for 10 minutes at 950° and a controlled cooldown was for the remainder of the cycle time.

The second conductor composition comprised metallic copper powder and an organic medium (copper based conductor, type 5086 sold by Du Pont).

(d) The second conductor composition was printed over the first conductor metallization layer as described in step (e) in Example 1 above, in several print and dry steps in order to achieve a fired thickness of 60 microns.

(e) Similar to step (c) above, the second conductor composition was dried in a Blue M oven.

(f) The paste was fired in an RTC furnace similar to step (c) above.

(g) Kover pins, sold by Astro Precision Inc., (Bayville, CT) were plated with 50 microinches of nickel by Surtronics Company (Raleigh, N.C.).

(h) The package components were assembled in a graphite fixture which held the ceramic substrate with the successive metallization layers, the brazing preform, and the plated pins in the proper positions on the metallization layer for firing. The brazing preforms were made of (61.5 Silver/24 Copper/14.5 Indium) and are sold by GTE Wesgo (Belmont, Calif.). The brazing preform was washer shaped and was placed over the extending pin shaft resting upon the head of the pin. The head of the pin was placed on the second metallization layer and held in place by the graphite fixture.

(i) Brazing was performed in an RTC furnace (Radiant Technology Corporation, Cerritos, Calif.) at a one hour profile with a peak temperature of 780° C. for 1 minute using a nitrogen atmosphere. After the part had cooled sufficiently, the graphite fixture was disassembled and the assembled package removed.

The strength of the pin attachment or joint to the ceramic substrate was tested on an Instron machine, (Instron Corp., Canton, Mass.) with a crosshead speed of 12 mm/min. The average strength to pull the pin from the substrate and/or the metallization layer was 20±2 pounds tested over 600 pins.

We claim:

1. A process for brazing a metallized component to a ceramic-based substrate comprising the steps of:
   (a) applying a first conductor composition to the ceramic-based substrate, the first conductor composition comprising a metal powder, an inorganic binder, and an organic medium;
   (b) drying said first conductor composition;
   (c) firing said first conductor composition at a temperature sufficient to wet the ceramic with said inorganic binder, sinter said metal powder and drive off the organic medium thereby forming a first metallization layer;
   (d) applying a second conductor composition to said first metallization layer such that said first metallization layer is covered by the second metallization layer, the second conductor composition consisting essentially of a metal powder and an organic medium;
   (e) drying said second conductor composition;
   (f) firing said second conductor composition at a temperature sufficient to sinter the metal powder of the second conductor composition and drive off the organic medium thereby forming said second metallization layer;
   (g) forming an assembly by positioning at least one metallized component on the second metallization layer and a brazing composition at the component-second metallization layer interface; and
   (h) heating said assembly at a temperature sufficient for said brazing composition to form a joint between said component and said second metallization layer.

2. The process of claim 1 wherein the ceramic-based substrate comprises alumina or glass-ceramic.

3. The process of claim 2 the assembly is heated to a temperature in the range of 500° to 840° C.

4. The process of claim 3 wherein said first conductor composition comprises by weight, basis total inorganic solids, finely divided particles of:
   (a) 75-95% metallic gold particles at least 90% by weight of which particles have an aspect ratio no greater than 2;
   (b) 0.5-10% cadmium borosilicate glass;
   (c) 0.1-5% spinel-forming divalent metal oxide selected from the group consisting of CuO, ZnO, MgO, CoO, NiO, FeO, MnO and mixtures thereof; and
   (d) 0.1-1.0% metal selected from the group consisting of palladium, platinum and rhodium;
   all of (a) through (d) being dispersed in
   (e) an organic medium.

5. A process for brazing a metallized component to a ceramic-based substrate comprising the steps of:
   (a) applying a first conductor composition on the ceramic-based substrate, said first conductor composition comprising a metal powder, an inorganic binder, and an organic medium;
   (b) drying said first conductor composition;
   (c) applying a second conductor composition to the first conductor composition such that said first conductor composition is covered by said second conductor composition, the second conductor composition consisting essentially of a metal powder and an organic medium;
   (d) drying said second conductor composition;
   (e) firing said first and second conductor composition at a temperature sufficient to wet the ceramic with the inorganic binder, sinter said metal powder and drive off the organic medium thereby converting the conductor compositions into metallized layers;
   (f) forming an assembly by positioning at least one metallized component on said second metallization layer and a brazing composition at the component-second metallization layer interface; and
   (g) heating said assembly at a temperature sufficient for said brazing composition to form a joint between said component and said second metallization layer.

6. The process of claim 5 wherein the ceramic-based substrate comprises alumina or glass-ceramic.

7. The process of claim 6 the assembly is heated to a temperature in the range of 500° to 840° C.

8. The process of claim 7 wherein said first conductor composition comprises by weight, basis total inorganic solids, finely divided particles of:
   (a) 75-95% metallic gold particles at least 90% by weight of which particles have an aspect ratio no greater than 2;
   (b) 0.5-10% cadmium borosilicate glass;
   (c) 0.1-5% spinel-forming divalent metal oxide selected from the group consisting of CuO, ZnO, MgO, CoO, NiO, FeO, MnO and mixtures thereof; and
   (d) 0.1-1.0% metal selected from the group consisting of palladium, platinum and rhodium;
   all of (a) through (d) being dispersed in
   (e) an organic medium.

9. A process for brazing a metallized component to a metallized ceramic-based substrate comprising the steps of:
   (a) applying a second conductor composition over the metallizations on the substrate such that the metallizations are covered by said second conductor composition which consists essentially of a metal powder and an organic medium;
   (b) drying said second conductor composition;
   (c) firing said second conductor composition at a temperature sufficient to sinter the metal powder of the second conductor composition and drive off said organic medium thereby forming a second metallization layer;

(d) forming an assembly by positioning at least one metallized component on said second metallization layer and a brazing composition at the component-second metallization layer interface; and (e) heating said assembly at a temperature sufficient for said brazing composition to form a joint between said component and said second metallization layer.

10. The process of claim 9 wherein the ceramic-based substrate comprises alumina or glass-ceramic.

11. The process of claim 10 the assembly is heated to a temperature in the range of 500° to 840° C.

12. The process of claim 11 wherein said first conductor composition comprises by weight, basis total inorganic solids, finely divided particles of:

(a) 75-95% metallic gold particles at least 90% by weight of which particles have an aspect ratio no greater than 2;

(b) 0.5-10% cadmium borosilicate glass;

(c) 0.1-5% spinel-forming divalent metal oxide selected from the group consisting of CuO, ZnO, MgO, CoO, NiO, FeO, MnO and mixtures thereof; and (d) 0.1-1.0% metal selected from the group consisting of palladium, platinum and rhodium;

all of (a) through (d) being dispersed in (e) an organic medium.

* * * * *